(12) United States Patent
Thommana et al.

(10) Patent No.: US 8,900,703 B1
(45) Date of Patent: Dec. 2, 2014

(54) NANOTECHNOLOGY FOR PROTECTION OF PROPRIETARY HARDWARE AND SOFTWARE

(75) Inventors: John Thommana, Cedar Rapids, IA (US); Lizy Paul, Cedar Rapids, IA (US); Jeffrey D. Meyer, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1244 days.

(21) Appl. No.: 11/824,699

(22) Filed: Jul. 2, 2007

(51) Int. Cl.
*B32B 5/16* (2006.01)
*B32B 9/00* (2006.01)
*B32B 15/02* (2006.01)

(52) U.S. Cl.
USPC ............ 428/402; 428/403; 428/407; 977/700

(58) Field of Classification Search
USPC .................................................. 428/402–407
See application file for complete search history.

(56) References Cited

U.S. PATENT DOCUMENTS

| | | | |
|---|---|---|---|
| 4,236,156 A | | 11/1980 | Eden |
| 6,239,449 B1 * | | 5/2001 | Fafard et al. ................ 257/17 |
| 2003/0067668 A1 * | | 4/2003 | Feldheim et al. ............ 359/328 |
| 2003/0174384 A1 * | | 9/2003 | Halas et al. .................. 359/296 |
| 2004/0214001 A1 * | | 10/2004 | Oldenburg et al. .......... 428/404 |
| 2007/0102833 A1 * | | 5/2007 | Hack et al. ................... 257/789 |
| 2007/0154634 A1 * | | 7/2007 | Renn ............................ 427/180 |
| 2008/0009434 A1 * | | 1/2008 | Reches et al. ................... 514/2 |
| 2009/0032781 A1 * | | 2/2009 | Wang et al. ............... 252/521.2 |
| 2009/0213369 A1 * | | 8/2009 | Lee et al. ..................... 356/301 |

OTHER PUBLICATIONS

Boyd, et al, "Rice University researchers create 'nanorice'," found on web page: http://www.eurekalert.org/pub_releases/2006-03/ru-rur031406.php, Mar. 2006, 2 pgs. printed Jun. 27, 2007.
Nordlander, et al, "Abstract: P36.00004: Nanorice: a new hybrid nanostructure," 2006 APS March Meeting, found on web page: http://meetings.aps.org/Meeting/MAR06/Event/43240, 1 pg., printed Jun. 27, 2007.
Wang, et al, "Abstract: Nanorice: A Hybrid Plasmonic Nanostructure," American Chemical Society, Mar. 2006, found on web page: http://pubs.acs.org/cgi-bin/abstract.cgi/nalefd/2006/i04/abs/nl060209w.html, 1 pg., printed Jun. 27, 2007.

* cited by examiner

*Primary Examiner* — Ronak Patel
(74) *Attorney, Agent, or Firm* — Angel N. Gerdzhikov; Donna P. Suchy; Daniel M. Barbieri

(57) ABSTRACT

An electronic device is described. The electronic device includes a circuit chip. The electronic device also includes a coating covering at least a portion of the circuit chip. The coating further includes a nanomaterial, to protect the circuit chip from at least one of identifying the chip structure, reading memory locations, or modifying memory locations.

11 Claims, 6 Drawing Sheets

NANOTECHNOLOGY FOR PROTECTION OF PROPRIETARY HARDWARE AND SOFTWARE

BACKGROUND

Conventionally, software products created today have some form of proprietary and confidential information that is directly tied to the revenue generated from the sale of the product. Many of these products run on proprietary or generic hardware. Companies may potentially lose millions of dollars when these products are hacked into and their proprietary and confidential information is exposed.

Integrated Circuits (like microcontrollers, microprocessors, RAM, ROM, flash memory, hard-drives, etc.) used on commercial products can be subject to multiple levels of scrutiny to expose or extract proprietary information, internal details and possible loopholes. The advancements in technology are making it easier with the availability of lower cost tools to aid the hacker.

The attacks may be classified into the following categories:
a. Non-Invasive. Non-invasive techniques include glitching, power analysis and taking advantage of data remanence characteristics.
b. Semi-Invasive. Semi-invasive techniques include ultraviolet attacks, microscopy and fault injection.
c. Invasive. Invasive techniques include micro-probing, rear side attacks and reverse engineering.

Conventionally, most invasive and semi-invasive threats require removal of the chip package. Once the chip package is removed the passivation layer (protection layer) has to be removed. This is usually done by using a laser. Next, optical microscopes or various laser scanning tools (depending on the fabrication process and number of layers) are used to get high resolution pictures or to probe the inner workings and details of the chip.

Conventionally there is no deterrent to laser scanning tools.

Accordingly there is a need for detecting these threats and providing a method to combat these threats.

The techniques herein below extend to those embodiments which fall within the scope of the appended claims, regardless of whether they accomplish one or more of the above-mentioned needs.

SUMMARY

What is provided is an electronic device. The electronic device includes a circuit chip. The electronic device also includes a coating covering at least a portion of the circuit chip. The coating further includes a nanomaterial, to protect the circuit chip from at least one of identifying the chip structure, reading memory locations, or modifying memory locations.

What is also provided is an electronic device. The electronic device includes a circuit chip. The electronic device also includes at least one nano laser coupled to the circuit chip or built into the circuit chip, wherein the nano laser is configured to at least one of destroy at least one fusible link in the circuit chip or destroy or disable at least a portion of the circuit.

Further, what is provided is an electronic device. The electronic device includes a circuit chip. The electronic device also includes a coating covering at least a portion of the circuit chip, the coating includes a nanomaterial which absorbs light and produces current. Further, the electronic device comprises a device coupled to the circuit chip powered by the coating and configured to alter the chip when powered.

Further still, what is provided is an electronic device. The electronic device includes a circuit chip and a coating covering at least a portion of the circuit chip. The coating includes a nanomaterial that acts as a nanolens.

Yet further still, what is provided is an electronic device. The electronic device includes a circuit chip and a coating covering at least a portion of the circuit chip. The coating comprises a thermochromic coating.

Yet still further, what is provided is a method of protecting information relating to an electronic device. The method includes providing a circuit chip and depositing a coating over at least a portion of the circuit chip. The coating includes a nanomaterial, to protect the circuit chip from at least one of identifying the chip structure, reading memory locations, or modifying memory locations.

Alternative exemplary embodiments relate to other features and combination of features as may be generally recited in the claims.

BRIEF DESCRIPTION OF THE DRAWINGS

A better understanding of the features and advantages of the present invention will be obtained by reference to the following detailed description that sets forth illustrative embodiments by way of example only, in which the principles of the invention are utilized, and the accompanying drawings, of which.

DETAILED DESCRIPTION

Figure 1:
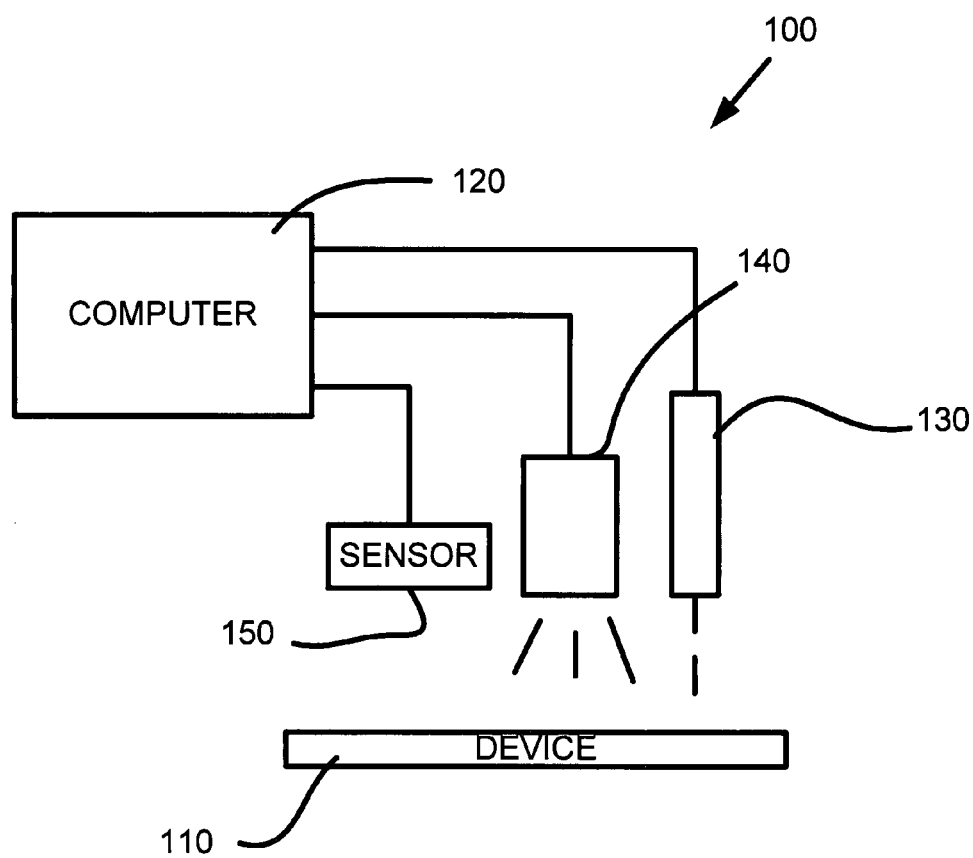
FIG. 1 is an exemplary block diagram depicting a laser scanning system.

Before describing in detail the particular improved system and method, it should be observed that the invention includes, but is not limited to a novel structural combination of conventional data/signal processing components and communications circuits, and not in the particular detailed configurations thereof. Accordingly, the structure, methods, functions, control and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

Conventional threat deterrents do not block advanced techniques, like optical and electron scanning techniques, of detecting proprietary information of an electronic device. Also, conventional threat deterrents do not block advanced techniques like optical and electron scanning techniques.

In accordance with one or more embodiments, techniques to detect and deter laser scanning techniques are therefore described.

Nanotechnology encompasses the theory and practice of manipulating materials on the atomic scale to create materials having novel properties due to their size, shape or composition. Nanoparticles exhibit different behaviors than bulk particles because nanoparticles do not obey the laws of quantum chemistry and the classical laws of physics. Some of the common properties that can be manipulated at the nano scale are color, magnetism, conductivity, optical properties, and melting points.

One of the most common uses of an optical microscope and laser scanner is to extract contents of storage devices like NAND Flash, NOR Flash, SRAM etc. Another use of laser scanning is to find memory protection bit fuses. Current advances in optical microscopes and laser scanning allow a perpetrator to read the state of transistors directly. It has also been used to induce optical faults to change the states of individual transistors to identify functionality and find location of fuses. For example, researchers at the University of Cambridge have used a 650 nm red laser and a cheap photo flash lamp to read and modify the contents of an SRAM directly by scanning. For example, a simplified set up of a scanning and/or modifying system 100 is depicted in FIG. 1. System 100 includes a device 110 which is to be read or modified. A computer 120 or other device controls the operation of a laser, a light source 140 and an optical sensor 150. In operation the computer controls the operations of devices 130, 140, 150 to modify or scan and identify device 110.

Figure 2:
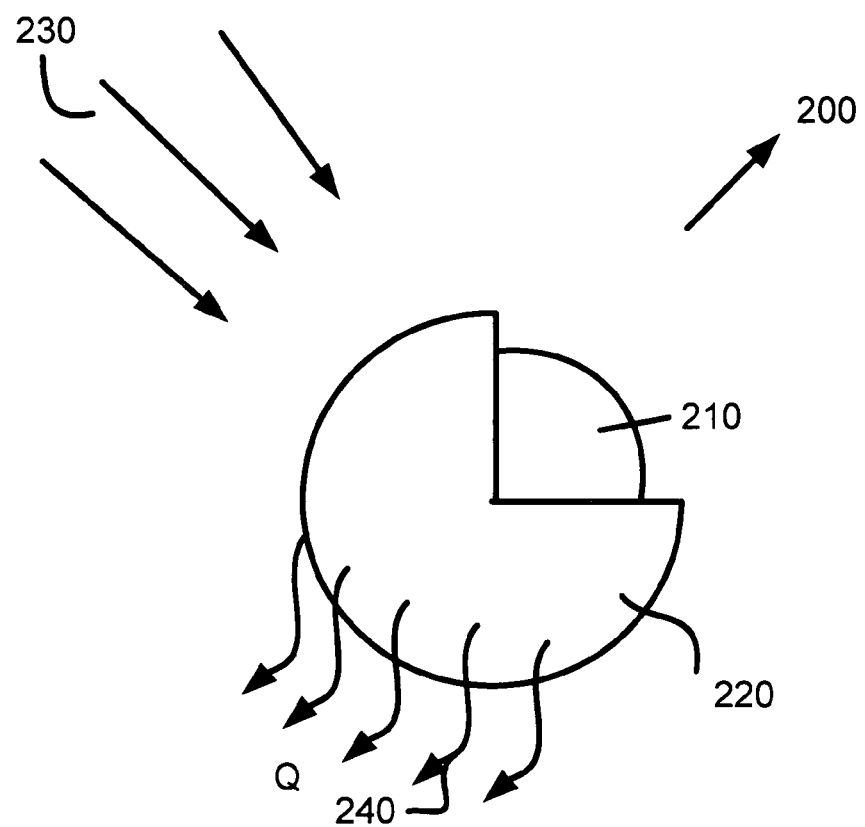
FIG. 2 is an exemplary diagram of a nanoshell that may be applied as a coating for an electronic circuit device.

One exemplary embodiment of the invention includes the use of Nanoshells 200 depicted in FIG. 2 for detecting optical microscope and laser scanning threats. Nanoshells are nanomaterials invented by researchers at Rice University. Nanoshells are silicon based nano-materials 210 coated with gold 220 to create nano lenses. These nano lenses absorb light 230 and generate heat 240. Their current use is to target and destroy cancer cells. Varying the Nanoshell thickness shifts the optical absorption wavelength (for example, the thinner the layer the longer the wavelength it absorbs). Coating the surface with a layer of thin strips of Nanoshells with different thicknesses will absorb most of the incident light and reduce the optical returns considerably to prevent creation of high resolution photography required for understanding the component layout and routing. It will also prevent readout and modification of memory components that reside below the Nanoshell coating.

Researchers at the University of Illinois have created a silicon-gold based nano-material that absorbs ultraviolet light and produces electrical current. Coating the IC with this material one can detect ultraviolet laser scanning threats. The current generated can be used to activate nano-circuits that can take evasive actions like scrambling and/or zeroizing memory locations, destroying critical components etc. It will also prevent readout and modification of memory components that reside below.

U.S. Pat. No. 6,239,449 entitled "Quantum Dot infrared photo detector (QDIP)" documents the use of Quantum Well Infrared Photo Detectors (QWIP) and QDIP nano-sensors that absorb infrared light and produce electrical currents. The wavelength of the photo detector is controlled by the size and thickness of the nano-material used. An embodiment of the infrared laser scanning detection is to coat the surface of the IC with a layer of QDIP/QWIP. The current generated can be used to activate nano-circuits that can take evasive actions like scrambling and/or zeroizing memory locations, destroying critical components etc. It may also be used to prevent readout and modification of memory components that reside below.

Figure 3:
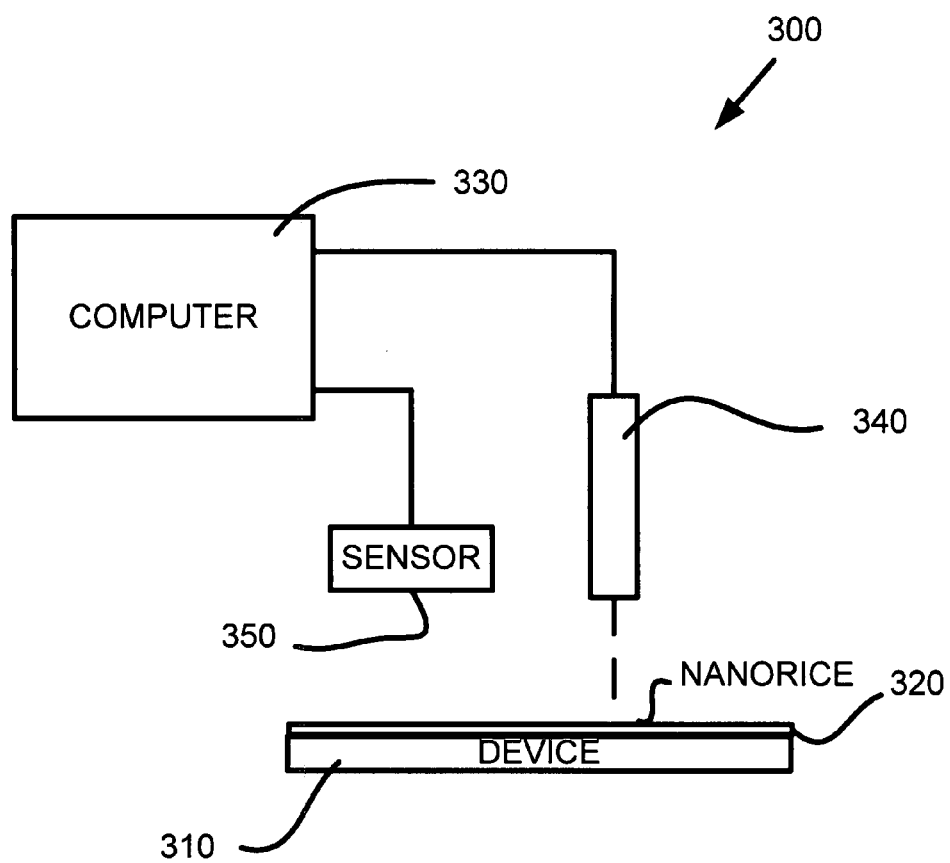
FIG. 3 is an alternative exemplary block diagram depicting a laser scanning system.
Figure 4:
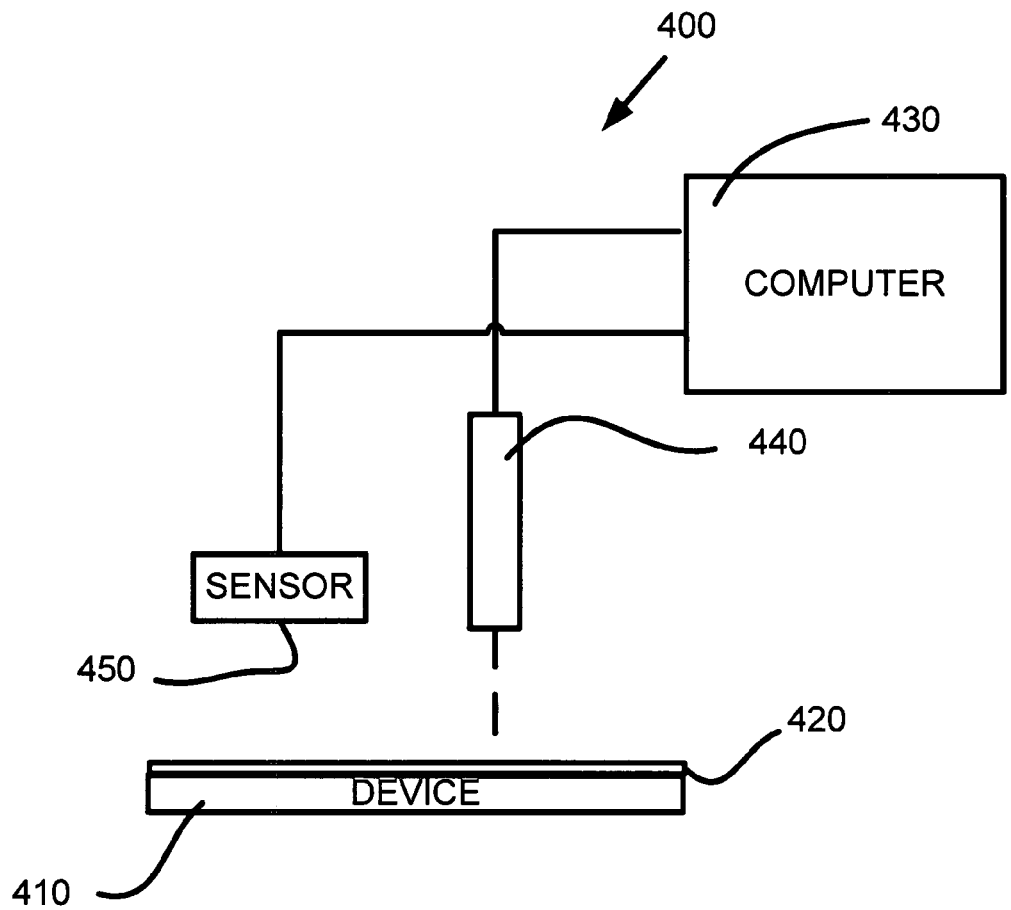
FIG. 4 is an alternative exemplary block diagram depicting a laser scanning system.

Researchers at Rice University have created an iron-oxide substrate coated with gold nano-material called Nanorice. Nanorice will be used to focus light on small regions of space to improve the clarity of the images obtained by scanning microscopes (laser and electron). An embodiment of this invention as depicted in FIG. 3 is to coat an IC 310 with a Nanorice coating 320 that has the inverse characteristics i.e. it will blur the image instead of sharpening it (property dependent on shape and size of the nano-material). In such a system a scanning system having a computer 330, coupled to a laser 340 and a sensor 350 could be used in an attempt to determine the IC design. However because of the nanorice, the sensor will not be able to pick up a clear picture of the underlying structure in IC 310. Another embodiment is to create a layer of varying focal length Nanorice layer as most optical and laser scanning devices can generate only a single focused beam at a time. If the perpetrator has to change focusing every micrometer to extract details it will require a very long time to map out the details of the IC.

Figure 5:
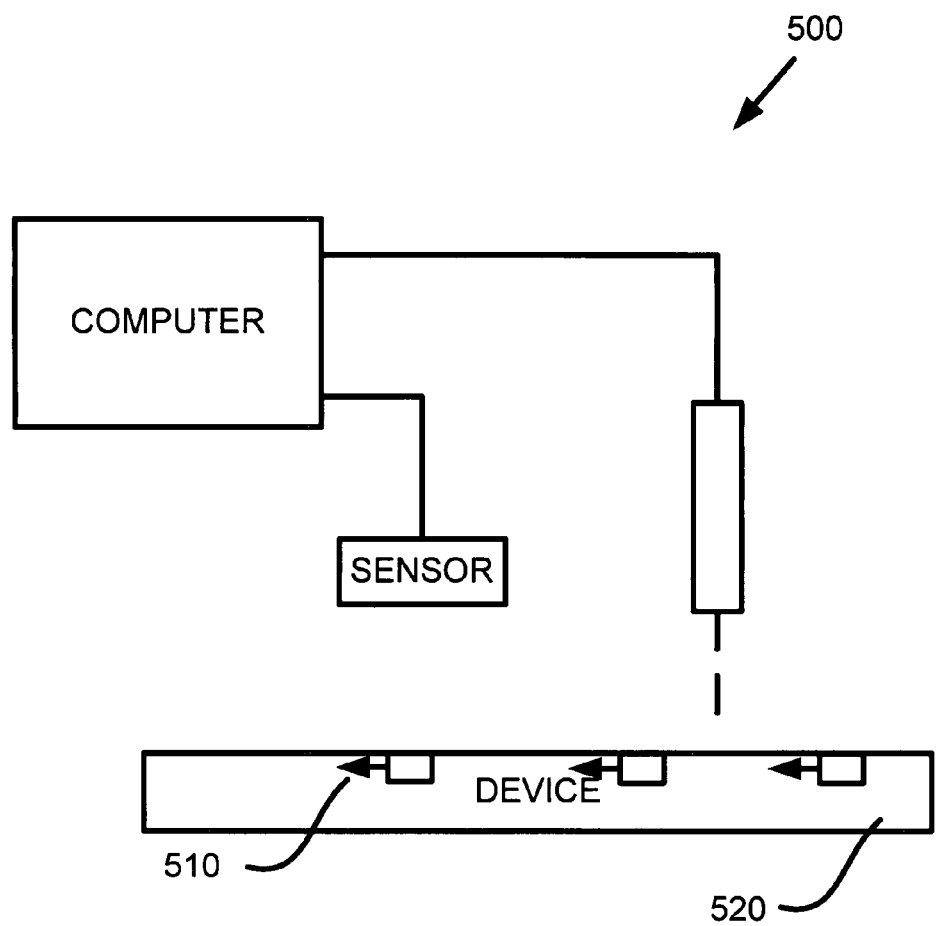
FIG. 5 is an alternative exemplary block diagram depicting a laser scanning system.

Erbium Doped Fiber Amplifiers (EDFA) have been used in optical communication to increase the span of fibers. EDFA is an optical fiber that has been uniformly doped with Erbium ions. When the input signal photon collides with an erbium ion it releases a stimulated photon similar to the one colliding with it (probabilistic activity). The energy released by the photon recharges the erbium ion. Thus an avalanche of photons is created. An embodiment of the invention depicted in FIG. 5 is to create nano optical lasers 510 when manufacturing IC 520 to act in response to the incident laser to destroy/mutilate/change selective areas of the IC. They can be used to burn specific nano fuses that are embedded in the IC that will indicate incorrect functionality or the enhanced energy can be used to trigger evasive actions like scrambling and/or zeroizing memory locations, destroying critical components etc.

Another known invention is the use of Vanadium Dioxide ($VO_2$) in thermochromic windows as an energy saving device. Vanadium Dioxide transforms from a transparent insulator into a reflective metal thereby reflecting light (infrared to ultraviolet). When the metal is colder than 68 degrees Celsius it is transparent and when it is heated to a couple of degrees above 68 degree Celsius it becomes reflective. This type of thermo-chromic behavior has been observed in many metal oxides like $Ti_2O_3$, $Fe_3O_4$, $Mo_9O_{26}$, and the vanadium oxide family $V_nO_{2n-1}$. Subsequent inventions have succeeded in lowering the transformation temperature (as low as 10 degree Celsius) considerably by adding various impurities niobium, molybdenum, tungsten, chromium and aluminum. Varying the particle size also affects the reflected wavelength and the transition characteristics. An embodiment of the invention is to coat the IC 410 with vanadium dioxide 420 which is reflective at room temperature. The composition can be adjusted to have reflective properties at commonly used light frequencies. To defeat this, the IC has to be cooled below the triggering temperature. Typically, a laser scanning system having a laser 440 and a sensor 450 coupled to a computer would not know about the presence of layer 420 on IC 410 and further would not be aware of the layer 420 transitioning temperature. Therefore the scanning system would not be useful for identifying the IC structure or other purposes.

Figure 6:
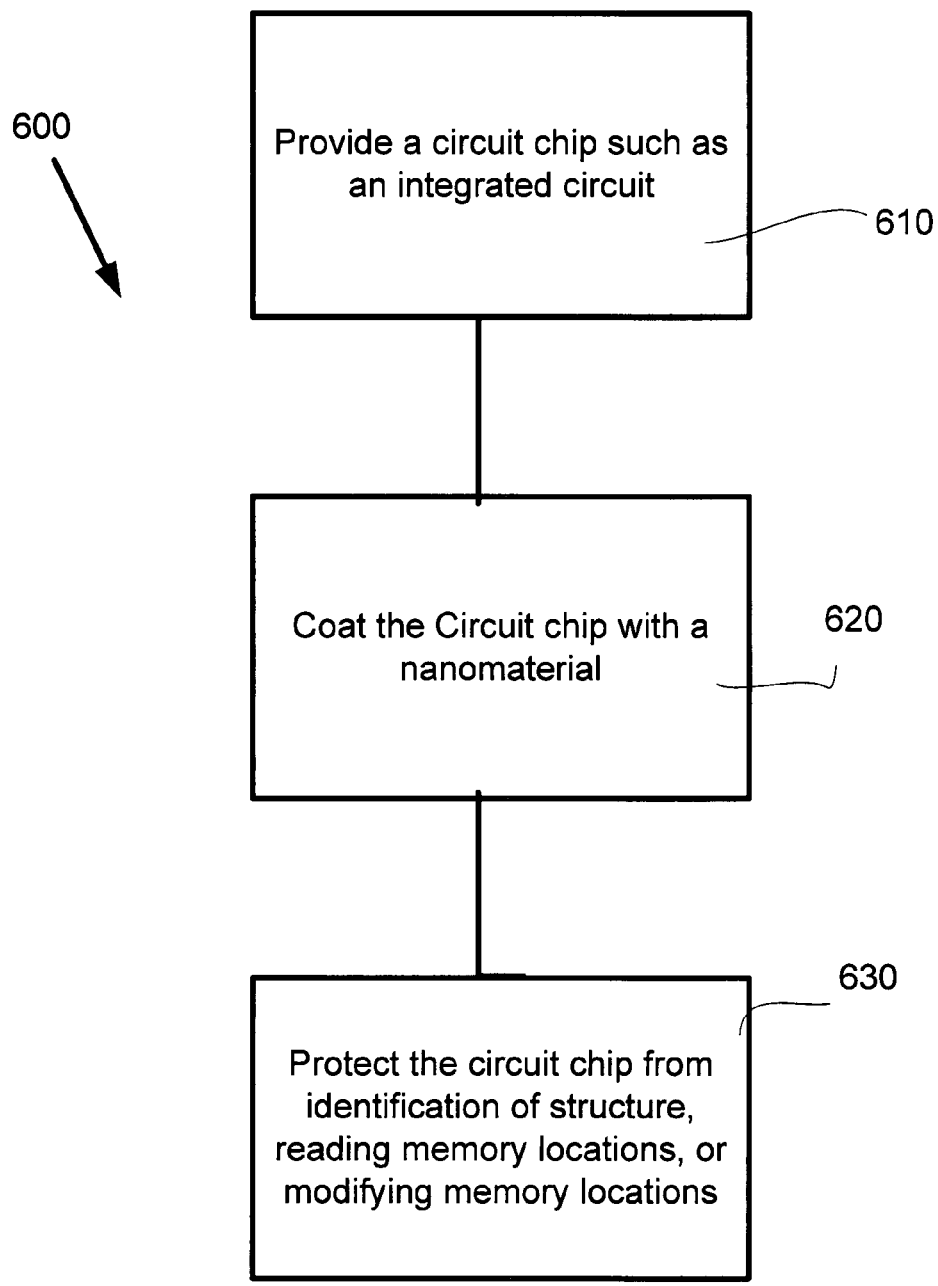
FIG. 6 is an exemplary process diagram in accordance with at least one embodiment.

Referring now to FIG. 6, a method 600 of protecting information relating to an electronic device includes first providing a circuit chip (process 610) that may have proprietary information as the chip design or may have proprietary information relating to the functioning of the chip, or the method may include the process of preventing the altering of information stored on or used by the chip. Method 600 also includes depositing a coating over at least a portion of the circuit chip (process 620). In an exemplary embodiment, the coating includes a nanomaterial, to protect the circuit chip from at least one of identifying the chip structure, reading memory locations, or modifying memory locations (process 630). Any of a variety of chip designs and nanomaterials may be used without departing from the scope of the invention.

While the detailed drawings, specific examples, and particular formulations given described exemplary embodiments, they serve the purpose of illustration only. It should be understood that various alternatives to the embodiments of the invention described maybe employed in practicing the invention. It is intended that the following claims define the scope of the invention and that structures within the scope of these claims and their equivalents be covered thereby. The hardware and software configurations shown and described may differ depending on the chosen performance characteristics and physical characteristics of the computing and analysis devices. For example, the type of computing device, communications bus, or processor used may differ. The systems shown and described are not limited to the precise details and conditions disclosed. Method steps provided may not be limited to the order in which they are listed but may be ordered any way as to carry out the inventive process without departing from the scope of the invention. Furthermore, other substitutions, modifications, changes and omissions may be made in the design, operating conditions and arrangements of the exemplary embodiments without departing from the scope of the invention as expressed in the appended claims.

The invention claimed is:

1. An electronic device, comprising:
    a circuit chip; and
    a nanomaterial coating, the nanomaterial coating forming a continuous layer of nanomaterial that covers a continuous surface of the circuit chip and protects the circuit chip from: identifying a chip structure of the circuit chip, wherein the nanomaterial coating includes strips of nanoshells with different thicknesses for shifting optical absorption wavelength of the nanomaterial coating, wherein said nanoshells are silicon based nanomaterials coated with gold.

2. The electronic device of claim 1, wherein the nanomaterial coating comprises at least one of a QDIP coating or a QWIP coating.

3. An electronic device comprising:
    a circuit chip;
    a nanomaterial coating covering a continuous surface of the circuit chip, the coating forming a continuous layer of nanomaterial which includes strips of nanoshells with different thicknesses, which absorbs light and produces current; and
    a device coupled to the circuit chip powered by the coating and configured to alter the chip when powered, wherein said nanoshells are silicon based nanomaterials coated with gold.

4. The electronic device of claim 3, wherein the chip is altered by activating a nanocircuit which scrambles signals on the chip.

5. The electronic device of claim 3, wherein the chip is altered by activating a nanocircuit which zeroes memory on the chip.

6. The electronic device of claim 3, wherein the chip is altered by activating a nanocircuit which at least partially destroys functioning of the chip.

7. An electronic device, comprising:
    a circuit chip; and
    a coating covering a continuous portion of the circuit chip, wherein the coating includes a continuous layer of nanomaterial which includes strips of nanoshells with different thicknesses that protect the circuit chip from at least one of: reading memory locations, wherein said nanoshells are silicon based nanomaterials coated with gold or modifying memory locations.

8. The electronic device of claim 7, wherein the nanomaterial blurs an image produced by an imaging device.

9. The electronic device of claim 7, wherein the nanomaterial blurs an image produced by an imaging device.

10. The electronic device of claim 7, wherein the nanomaterial prevents imaging of the circuit chip.

11. A method of protecting information relating to an electronic device, comprising:
    providing a circuit chip; and
    depositing a nanomaterial coating over a continuous surface of the circuit chip, the nanomaterial coating including strips of nanoshells with different thicknesses for shifting optical absorption wavelength of the nanomaterial coating, the nanomaterial coating forming a continuous layer of nanomaterial that covers said continuous surface of the circuit chip and protects a chip structure of the circuit chip from being identified, wherein said nanoshells are silicon based nanomaterials coated with gold.

* * * * *